US007409081B2

(12) United States Patent
Ogi

(10) Patent No.: US 7,409,081 B2
(45) Date of Patent: Aug. 5, 2008

(54) APPARATUS AND COMPUTER-READABLE MEDIUM FOR ASSISTING IMAGE CLASSIFICATION

(75) Inventor: Hiroshi Ogi, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 815 days.

(21) Appl. No.: 10/391,802

(22) Filed: Mar. 20, 2003

(65) Prior Publication Data

US 2003/0202703 A1    Oct. 30, 2003

(30) Foreign Application Priority Data

Apr. 25, 2002    (JP)    .................... P2002-123870

(51) Int. Cl.
*G06K 9/00* (2006.01)
*G06F 3/048* (2006.01)
(52) U.S. Cl. .................. 382/145; 382/144; 715/838
(58) Field of Classification Search .......... 382/145
See application file for complete search history.

(56) References Cited

U.S. PATENT DOCUMENTS

| | | | | |
|---|---|---|---|---|
| 4,504,970 | A | * | 3/1985 | Werth et al. .............. 382/159 |
| 5,060,065 | A | * | 10/1991 | Wasserman ............... 348/131 |
| 5,226,118 | A | * | 7/1993 | Baker et al. .............. 715/833 |
| 5,592,100 | A | * | 1/1997 | Shida et al. ............... 324/751 |
| 5,796,868 | A | * | 8/1998 | Dutta-Choudhury ...... 382/199 |
| 5,893,095 | A | * | 4/1999 | Jain et al. ................. 707/6 |
| 6,016,562 | A | * | 1/2000 | Miyazaki et al. .......... 714/724 |
| 6,118,893 | A | * | 9/2000 | Li ............................. 382/150 |
| 6,185,324 | B1 | * | 2/2001 | Ishihara et al. ............ 382/149 |

(Continued)

FOREIGN PATENT DOCUMENTS

JP    10-214866    8/1998

(Continued)

OTHER PUBLICATIONS

Di Mauro, E. C., "Chech! A Generic and Specific Industrial Inspection Tool", IEEE Proceedings: Vision, Image and Signal Processing, (Aug. 1996), vol. 143, No. 4.*

*Primary Examiner*—Matthew C Bella
*Assistant Examiner*—Sath V. Perungavoor
(74) *Attorney, Agent, or Firm*—McDermott Will & Emery LLP

(57) ABSTRACT

An inspection system 1 includes an image pickup apparatus 2 for picking up an image of a defect, an inspection and classification apparatus 4 for performing inspection and automatic classification of defects, and a host computer 5. The host computer 5 performs learning for automatic classification at the inspection and classification apparatus 4. For creation of training data to be used for learning, defect images are arranged on a display of the host computer 5 on the basis of sizes of defects or imaging positions for picking up images of defects. A visual sign is provided to the defect image indicating a category assigned thereto. Further, in response to an operation by an operator, a statistical value of feature values of defect images included in a category, data obtained in inspection, images after being subjected to image processing, similar images or dissimilar images similar to or dissimilar to a defect image targeted for classification, an area directed to calculation of feature values in a defect image targeted for classification, and the like, are suitably displayed.

13 Claims, 10 Drawing Sheets

U.S. PATENT DOCUMENTS

| | | | | |
|---|---|---|---|---|
| 6,188,402 | B1 * | 2/2001 | Csipkes et al. | 715/705 |
| 6,259,520 | B1 * | 7/2001 | Zeimantz | 356/237.4 |
| 6,388,747 | B2 * | 5/2002 | Nara et al. | 356/394 |
| 6,421,122 | B2 * | 7/2002 | Nara et al. | 356/394 |
| 6,434,264 | B1 * | 8/2002 | Asar | 382/147 |
| 6,477,266 | B1 * | 11/2002 | Asar | 382/147 |
| 6,480,279 | B2 * | 11/2002 | Nara et al. | 356/394 |
| 6,542,830 | B1 * | 4/2003 | Mizuno et al. | 702/35 |
| 6,549,820 | B1 * | 4/2003 | Barrett et al. | 700/110 |
| 6,597,381 | B1 * | 7/2003 | Eskridge et al. | 715/804 |
| 6,611,728 | B1 * | 8/2003 | Morioka et al. | 700/109 |
| 6,760,890 | B2 * | 7/2004 | Makinen | 716/4 |
| 6,792,366 | B2 * | 9/2004 | Hosoya et al. | 702/83 |
| 6,792,367 | B2 * | 9/2004 | Hosoya et al. | 702/83 |
| 6,799,130 | B2 * | 9/2004 | Okabe et al. | 702/82 |
| 6,825,856 | B1 * | 11/2004 | Fazzio et al. | 345/646 |
| 6,898,305 | B2 * | 5/2005 | Hiroi et al. | 382/149 |
| 6,968,079 | B2 * | 11/2005 | Yoshikawa et al. | 382/145 |
| 6,973,209 | B2 * | 12/2005 | Tanaka | 382/149 |
| 6,975,754 | B2 * | 12/2005 | Hiroi et al. | 382/149 |
| 6,987,874 | B2 * | 1/2006 | Hirose et al. | 382/145 |
| 6,999,614 | B1 * | 2/2006 | Bakker et al. | 382/159 |
| 7,062,081 | B2 * | 6/2006 | Shimoda et al. | 382/149 |
| 7,068,834 | B1 * | 6/2006 | Ikeda et al. | 382/145 |
| 7,093,229 | B2 * | 8/2006 | Pang et al. | 716/21 |
| 7,103,505 | B2 * | 9/2006 | Teshima et al. | 702/183 |
| 7,113,628 | B1 * | 9/2006 | Obara et al. | 382/149 |
| 7,127,126 | B2 * | 10/2006 | Sakai et al. | 382/294 |
| 2001/0016061 | A1 * | 8/2001 | Shimoda et al. | 382/149 |
| 2002/0009220 | A1 | 1/2002 | Tanaka | |
| 2005/0232476 | A1 * | 10/2005 | Hayakawa et al. | 382/141 |

FOREIGN PATENT DOCUMENTS

| | | |
|---|---|---|
| JP | 2001-156135 | 6/2001 |
| WO | WO 01/41068 A1 | 6/2001 |

\* cited by examiner

APPARATUS AND COMPUTER-READABLE MEDIUM FOR ASSISTING IMAGE CLASSIFICATION

BACKGROUND OF THE INVENTION

1. Field of the Invention

The present invention relates to a technique of classification of an image of an object to be inspected.

2. Description of the Background Art

In a process of manufacturing a semiconductor substrate, a glass substrate, a printed circuit board, a mask used for exposure of a substrate or the like (all of which will be inclusively referred to as a "substrate"), visual inspection has been performed using an optical microscope or a scanning electron microscope, for example, to detect the existence of defects such as foreign objects, flaws, or etching failures. These defects thus detected in the inspection process have conventionally underwent detailed analysis. As a result, the cause of the defects have been specified, to take action such as countermeasures in response to the defects.

A substrate has been patterned with complicated and fine pattern features recently, so that the type and the amount of the detected defects are increasing. In response, auto defect classification (hereinafter referred to as "ADC") has been suggested which allows automatic classification of each defect detected in the inspection process into a class to be included (hereinafter referred to as a "category"). Even when various types of defects are detected in large quantity, ADC allows rapid analysis of the defects with high degree of efficiency. By way of example, attention may be directed to a category including defects with a high frequency of occurrence among those classified by ADC, so that such category can be given high priority for its countermeasures.

Automatic classification of the results of inspection is not limited to ADC for classifying defects, but it is also directed to various objects. For example, as a classifier for making classification into different categories, a neural network, a decision tree, discriminant analysis and the like, are employed.

In order for the classifier to be operative to perform automatic classification, training data responsive to a desired category is prepared in advance, and learning is necessary to the classifier. By way of example, in the classification under ADC, an operator observes a plurality of defect images, determines a category suitable for each defect image and teaches the result of determination, whereby the training data is created.

The performance of automatic classification largely depends on the quality of the training data to be learned by the classifier. In order to provide high quality of the training data, the operator is required a large amount of teaching work with high precision, taking a good deal of effort. In view of this, an environment for efficiently assisting the operator has been required to realize teaching work with sufficient rapidity and high precision.

When correction of or addition to existing data is to be taught, the operator should be provided with information to determine whether modification necessitated by the correction or addition is reasonable. Otherwise, such modification may not necessarily result in improvement in quality of the training data.

In order to assist classification by the operator, images may be arranged and displayed on the basis of feature values of the images, the exemplary technique of which is disclosed in Japanese Patent Application Laid-Open No. 2001-156135. However, information other than feature values is not used for assisting classification, and therefore, the operator cannot be provided with information for assisting the operator to determine whether decline in quality of the training data occurs due to the conditions for calculating feature values (in other words, the image is singular) or not. Due to this, this technique cannot necessarily provide the environment for adequately and efficiently performing classification.

In a so-called in-line inspection system including connection of an inspection apparatus and a classification apparatus for performing ADC, an image obtained by the inspection apparatus has a low resolution. Therefore, inadequate teaching work by the operator will quite likely. Further, although the inspection apparatus creates various types of useful information for classification and the classification apparatus creates useful information for inspection, effective use of such information has not been allowed.

SUMMARY OF THE INVENTION

It is an object of the present invention to provide an environment for efficiently classifying an image of an object. The present invention is directed to an apparatus for assisting an input to classify an image of an objected. The image is obtained in inspection.

According to the present invention, the apparatus comprises a display for displaying images, an input device for accepting an input to classify an image of an object, and a processing part for displaying an image(s) or information for assisting an input to classify the image of the object on the display.

In one preferred embodiment of the present invention, the processing part decides order of a plurality of objects on the basis of sizes of the plurality of objects which are indicated by a plurality of images prepared in advance, or on the basis of imaging positions for picking up the plurality of images of the plurality of objects, to arrange the plurality of images on the display according to the order.

Accordingly, images to be included in the same class are displayed on the display in contiguous relation. As a result, an operator is allowed to easily classify an image.

In another preferred embodiment of the present invention, the processing part arranges a plurality of images prepared in advance each indicating an object on the display, while specifying a class assigned to each of the plurality of images, and providing a visual sign indicating the class to each of the plurality of images.

As a result, the operator is allowed to easily make reference to other images included in the same class to be assigned.

In still another preferred embodiment of the present invention, the processing part calculates a statistical value of feature values of a plurality of images included in a class inputted through the input device. Each of the plurality of images are prepared in advance and indicates an object. The processing part further calculates feature values of an image targeted for an input of the class, and displays the statistical value and the feature values of the image targeted for the input of the class on the display.

As a result, on the basis of the feature values, the operator is allowed to easily determine a class in which an image is to be included.

In yet another preferred embodiment of the present invention, the processing part displays an image of an object, and data obtained in inspection for the object on the display.

As a result, the operator is allowed to perform classification with reference to the data obtained in the inspection.

In a further preferred embodiment of the present invention, the processing part performs image processing on an image of an object, and displays the image of the object and an image after being subjected to image processing on the display.

As a result, the operator is allowed to more suitably make reference to an image of an object.

In a still further preferred embodiment of the present invention, the processing part calculates feature values of a plurality of images prepared in advance each indicating an object, and feature values of an image targeted for an input of a class, to distinctively display selected images among the plurality of images on the display. Each of the selected images has feature values satisfying a predetermined condition depending on the feature values of the image targeted for the input of the class.

As a result, the operator is allowed to easily make reference to an image usable for assisting classification.

In a yet further preferred embodiment of the present invention, the processing part specifies an area of an image of an object, directed to calculation of feature values to be referred to for an input of a class, and displays the image of the object on the display in a manner allowing the area to be distinctively indicated.

As a result, the operator is allowed to determine whether feature values are calculated from an appropriate area.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
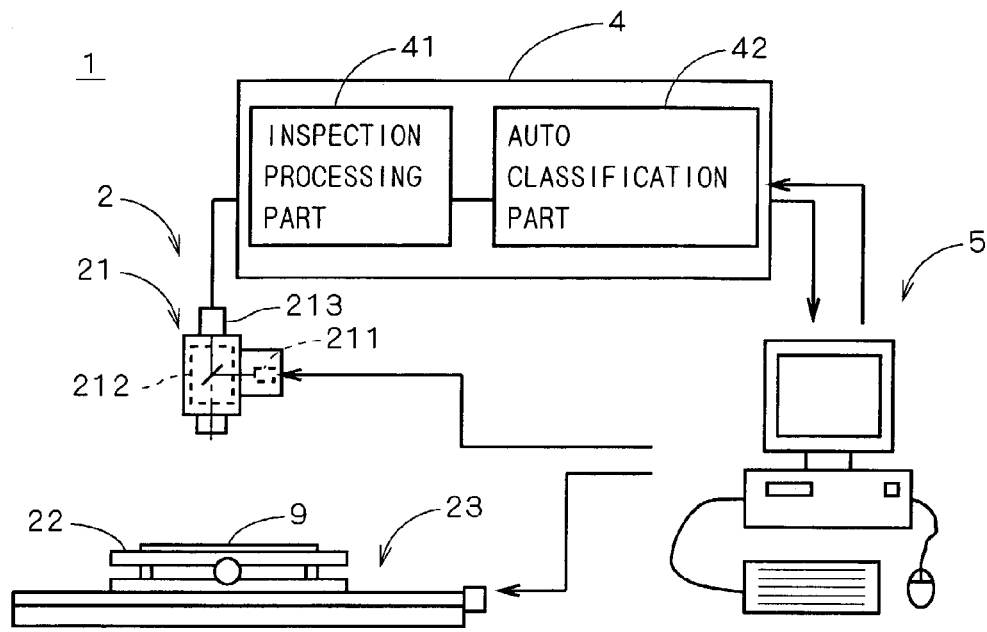
FIG. 1 shows a schematic configuration of an inspection system.

FIG. 1 shows a schematic configuration of an inspection system 1 for inspecting defects on a semiconductor substrate and performing automatic classification of detected defects. The inspection system 1 comprises an image pickup apparatus 2 for picking up an image of an inspection area on a semiconductor substrate (hereinafter referred to as a "substrate") 9, an inspection and classification apparatus 4 for detecting defects on the basis of image data obtained by the image pickup apparatus 2, and automatically classifying defects (i.e., performing ADC), when detected, into a category (class) to be included, and a host computer 5 for controlling an overall operation of the inspection system 1. The image pickup apparatus 2 is incorporated into a manufacturing line of the substrate 9, and therefore, the inspection system 1 is configured as a so-called in-line system.

The image pickup apparatus 2 comprises an image pickup part 21 for picking up an image of the inspection area on the substrate 9 to obtain image data, a stage 22 for holding the substrate 9, and a stage driving part 23 for moving the stage 22 relative to the image pickup part 21. The image pickup part 21 comprises a lighting part 211 for emitting light for illumination, an optical system 212 for guiding the light for illumination to the substrate 9, and receiving light entering from the substrate 9, and an image pickup device 213 for converting an image of the substrate 9 formed by the optical system 212 into an electric signal. The stage driving part 23 includes ball screws, guide rails, and motors. The stage driving part 23 and the image pickup part 21 are controlled by the host computer 5, whereby the image of the inspection area on the substrate 9 is picked up.

The inspection and classification apparatus 4 comprises an inspection processing part 41 for simultaneously performing processing of image data of the inspection area and defect inspection, and an auto classification part 42 for defect classification. Images of defects which are obtained in inspection are images of objects to be classified at the auto classification part 42. The inspection processing part 41 includes an electric circuit specifically directed to high-speed processing of the image data of the inspection area. The inspection processing part 41 is responsible for comparison between the picked-up image and a reference image, and image processing for defect inspection of the inspection area. That is, the image pickup apparatus 2 and the inspection processing part 41 are operative to function as an inspection apparatus of the inspection system 1. When the inspection processing part 41 detects a defect from the inspection area, image data of the defect and various types of data used for inspection are temporarily stored in a memory of the inspection processing part 41.

The auto classification part 42 includes a CPU for performing a variety of operations, a memory for storing various types of information, and the like. The auto classification part 42 is responsible for classification of the detected defects on software using a neural network, a decision tree, or discriminant analysis, for example. In addition to the function of controlling the inspection system 1, the host computer 5 is also operative to create various parameters to be used for classification (namely, conditions of classification) by the auto classification part 42. The parameter creation is realized by learning. With respect to the image displayed on the host computer 5, the operator performs classification (teaching) by inputting a category (class). In response, the host computer 5 creates training data, and performs learning. The result of learning is then outputted as the parameters to be used for automatic classification to the auto classification part 42. The host computer 5 has a number of functions for assisting classification by the operator, namely, for assisting an input of a category. That is, the host computer 5 is also operative as an apparatus for assisting (defect) classification.

Figure 2:
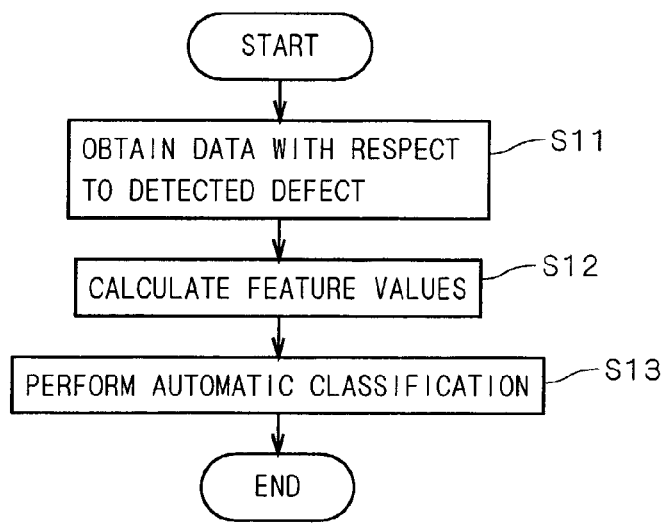
FIG. 2 shows a process flow of the inspection system when a defect is detected.

FIG. 2 shows a process flow of the inspection system 1 when a defect is detected at the inspection processing part 41.

First, the auto classification part 42 receives and obtains data of an image of the inspection area (defect image) and data required for inspection processing (such as a differential image or a reference image) from the inspection processing part 41 (step S11). Next, feature values are calculated from a defect image at the auto classification part 42 (step S12). The calculation of feature values may be performed at the inspection processing part 41. An area directed to calculation of feature values is suitably determined by the inspection processing part 41 or the auto classification part 42. Thereafter, the detected defects undergo automatic classification (step S13). That is, feature values and the various type of data are inputted to a classifier of the auto classification part 42 which has previously received the result of learning from the host computer 5, and the result of classification is outputted from the auto classification part 42. The feature value represents a value obtained by computation of pixel values under a predetermined rule. In many cases, the feature value is obtained by filtering the image in some way. A value of an image indicative of any feature thereof is regarded as a feature value. As an example, such value includes mean brightness, texture information, largeness (i.e., dimensions) of an area satisfying a predetermined condition, or edge quantum to be extracted.

In the inspection system 1, every time a defect is detected at the inspection processing part 41, the process shown in FIG. 2 is followed in real time, whereby a large number of images each indicating a defect are classified at high speed.

For the teaching work as preparatory work for classification by the auto classification part 42, the host computer 5 assists the operator with classification. the detail of which is as given below.

Figure 3:
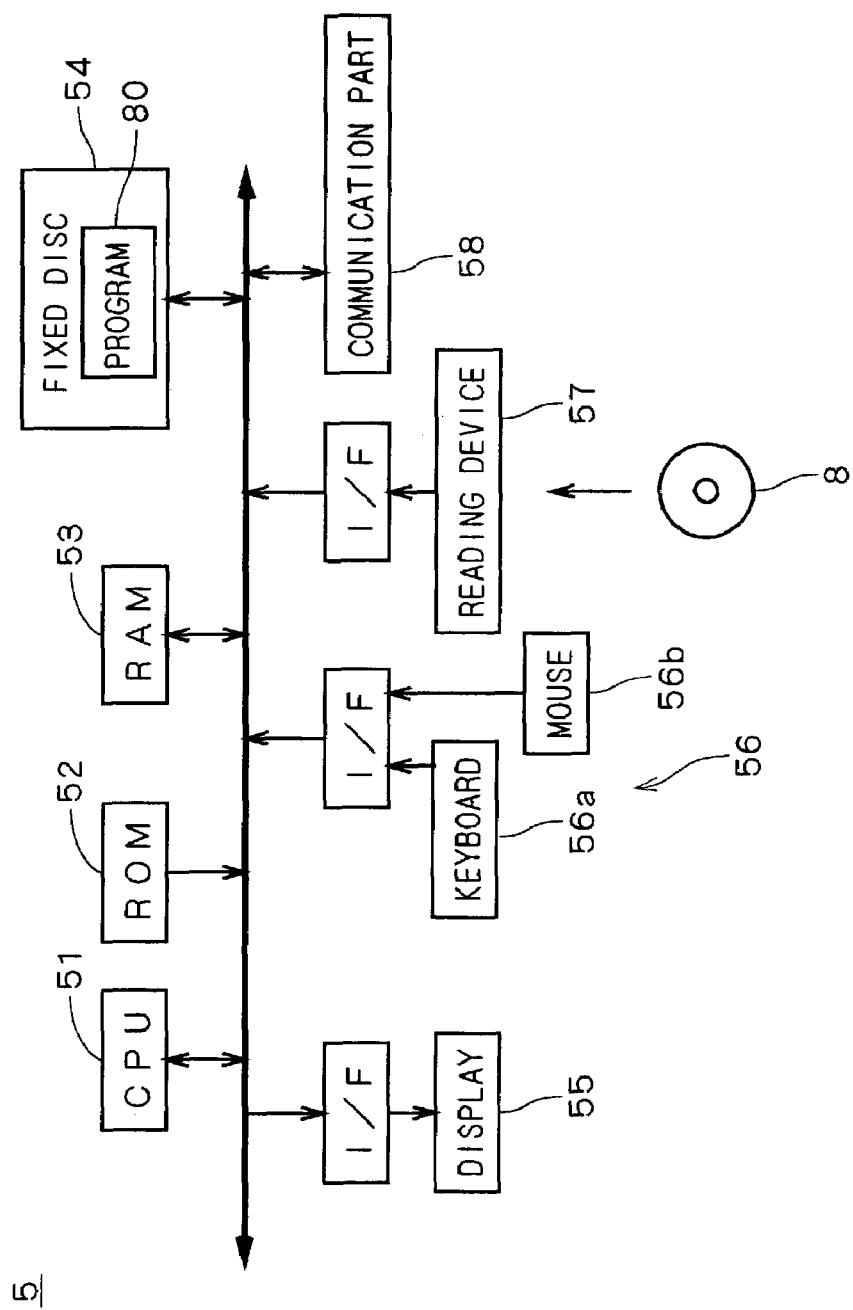
FIG. 3 shows a configuration of a host computer.

As shown in FIG. 3, the host computer 5 has a general computer system including a bus line connecting a CPU 51 for performing various operations, a ROM 52 for storing a basic program, and a RAM 53 for storing various types of information. Through an interface (I/F) if necessary, for example, the bus line also connects a fixed disc 54 for storing information, a display 55 for displaying various types of information such as an image, a keyboard 56a and a mouse 56b for receiving an input from the operator (hereinafter collectively referred to as a "input part 56"), a reading device 57 for reading information from a computer-readable recording medium 8 such as an optical disc, a magnetic disc, or a magneto-optical disc, and a communication part 58 for transmitting and receiving a signal to and from the other constituents of the inspection system 1.

A program 80 is read in advance from the recording medium 8 into the host computer 5 through the reading device 57, and is stored in the fixed disc 54. The program 80 is then copied into the RAM 53 and the CPU 51 performs operation according to the program stored in the RAM 53, namely, the computer executes the program, whereby the host computer 5 becomes operative as a classification assisting apparatus.

Figure 4:
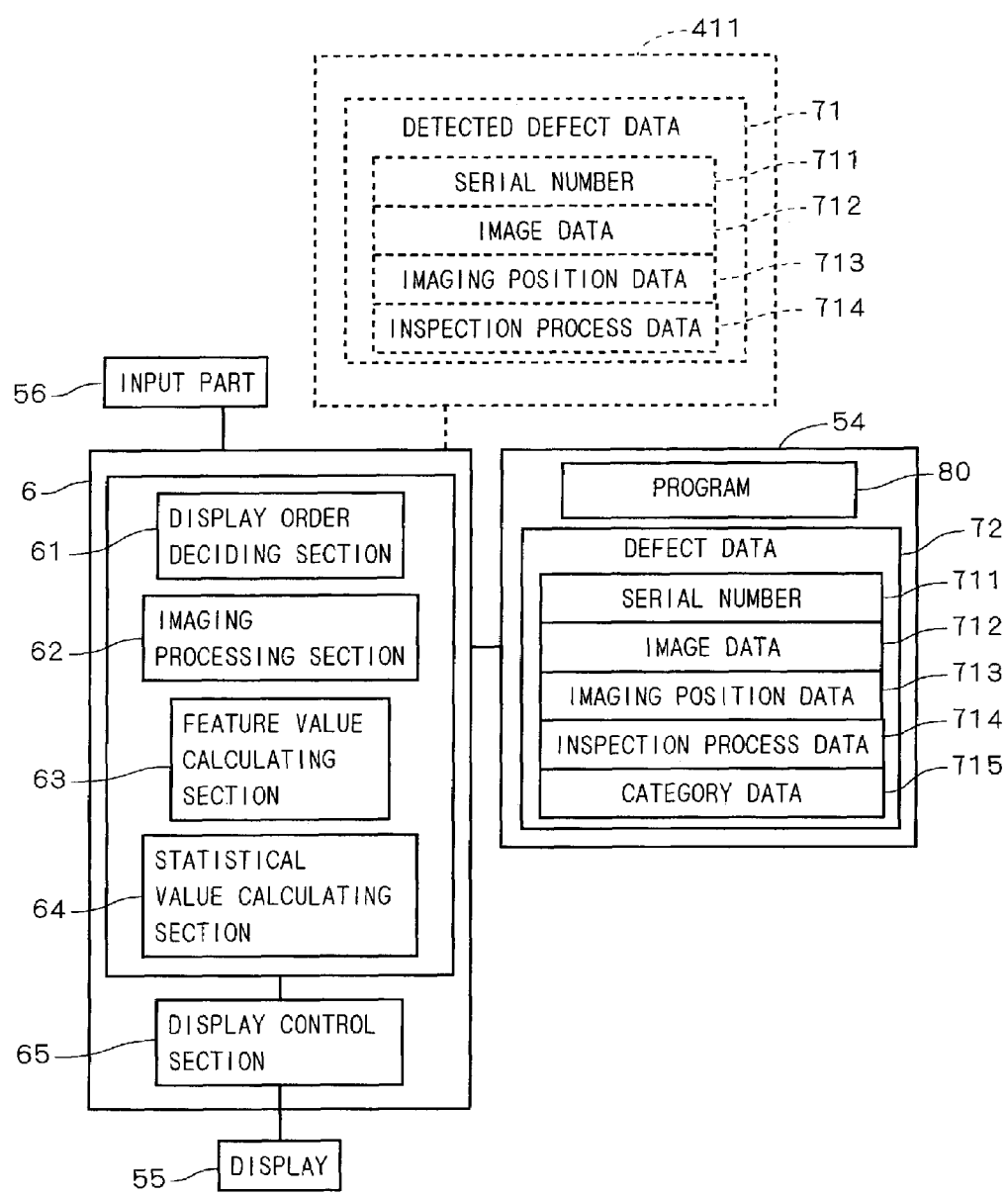
FIG. 4 is a block diagram showing functional constituents for assisting an input of a category.

When the CPU 51 is put into operation according to the program 80, the classification assisting apparatus is realized by the CPU 51, the ROM 52, the RAM 53, the fixed disc 54 and the like. The functional constituents of which are shown in the block diagram of FIG. 4. In FIG. 4, the blocks in a processing part 6 are the functions realized by the CPU 51, etc. Reference numeral 411 in FIG. 4 indicates a memory in the inspection processing part 41 of the inspection and classification apparatus 4.

As described, various types of data of the defects detected at the inspection processing part 41 (hereinafter generically referred to as "detected defect data") are stored in the memory 411. The detected defect data includes a serial number 711 as an identification number each assigned to the inspection area on the substrate 9, image data 712 of the inspection area obtained by the image pickup part 21, imaging position data 713 indicating an absolute or a relative position on the substrate 9 in the inspection area, and inspection process data 714 used in the inspection processing.

Figure 5:
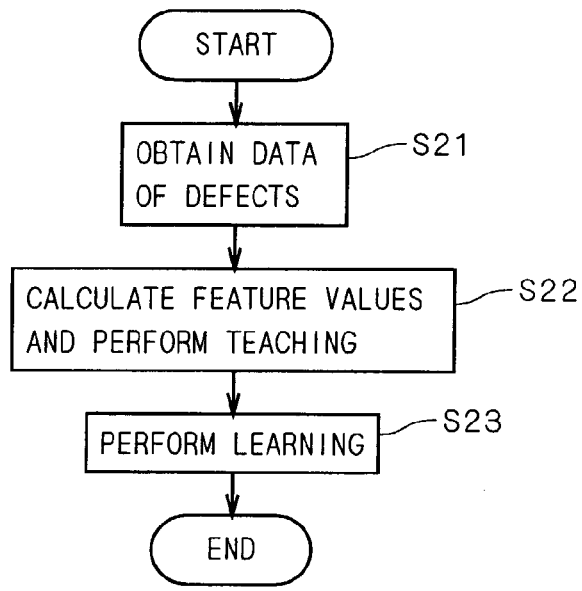
FIG. 5 shows a process flow of the inspection system when training data is created.

FIG. 5 shows a process flow when parameters (the result of learning) to be transmitted to the auto classification part 42 are created by the host computer 5.

First, the host computer 5 obtains various types of data of a plurality of defects (data of each defect correspond to detected defect data 71) from the inspection and classification apparatus 4 through the communication part 58, and stores the obtained data of each defect as defect data 72 in the fixed disc 54 as shown in FIG. 4 (step S21). At the time of initial learning, the fixed disc 54 contains no data on the defect. Therefore, category data 715 indicating unclassification is assigned to the obtained defect data 72 by the processing part 6.

Next, a feature value calculating section 63 of the processing part 6 calculates feature values from each image data 712 indicative of a defect, and the input part 56 accepts an input of a category with respect to a defect image as a target for classification by the operator according to a defect image displayed on the display 55. As a result, each defect is classified, namely, the result of classification is taught (step S22). In the teaching work at step S22, the host computer 5 assists the operator with determination and input of a category in which each defect is to be included (including an input of unclassification of a defect to designate the same as a defect not to be used for learning). Using the calculated feature values and the various types of information obtained by teaching, training data is created. When no category is determined for the detect, the category data 715 remains data indicating unclassification. Once the training data is created, the host computer 5 performs learning based on the training data, whereby the result of learning is obtained (step S23). When learning is completed, the result of learning is inputted to the auto classification part 42.

Various processes of the host computer 5 for assisting the operator with category input will be described next, on the assumption that the defect data 72 stored in the fixed disc 54 includes both data assigned with a category and unclassified data.

Figure 6:
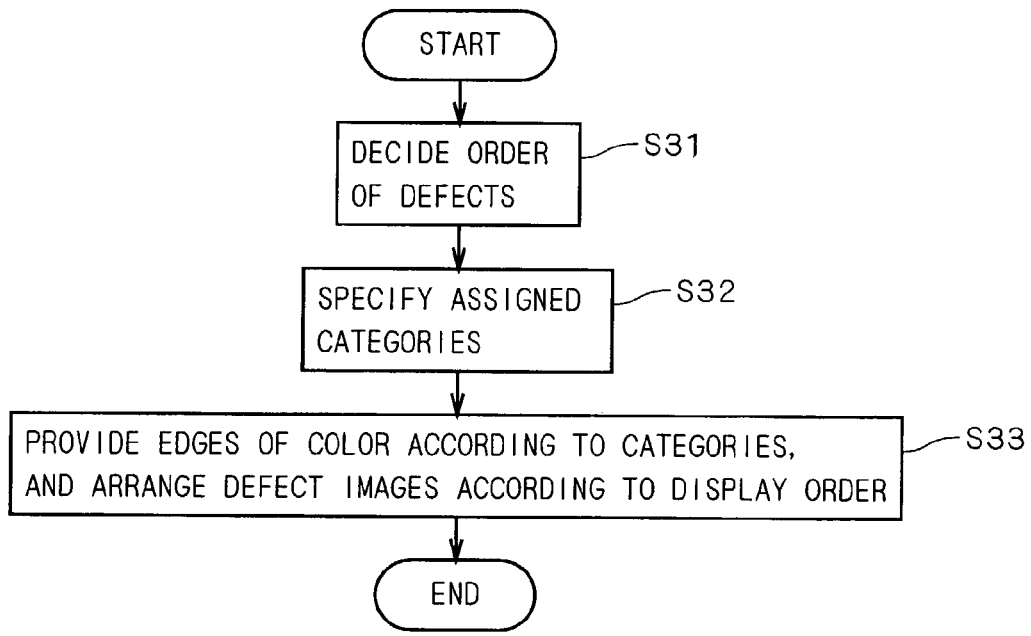
FIG. 6 shows a process flow when defect images are displayed on a display of the host computer.

FIG. 6 shows an exemplary flow of the processes for assisting the operator with category input. More particularly, the processes of the host computer 5 are shown at the time when the image data 712 (defect image) included in the defect data 72 stored in the fixed disc 54 is initially displayed on the display 55. First, in a display order deciding section 61 shown in FIG. 4, order of a plurality of defects is decided (step S31). The operator previously selects either "sorting by size (i.e., dimensions or area)" or "sorting by position" from menu items displayed on the display 55 through the input part 56, whereby the rule for deciding the order is made.

When "sorting by size" is selected, the image data 712 of more than one defect data 72 is transmitted to the display order deciding section 61. Then the display order deciding section 61 calculates the dimensions (area) of the defect, on the basis of which the order is decided. When "sorting by position" is selected, the imaging position data 713 of more than one defect data 72 is transmitted to the display order deciding section 61. Then the display order deciding section 61 decides the display order of defects on the basis of the imaging position data 713.

Figure 7:
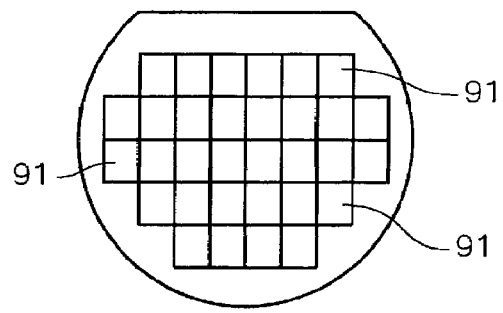
FIG. 7 explains imaging positions.

The imaging position of a defect is selectable between an absolute position and a relative position on the substrate 9. As shown in FIG. 7, the substrate 9 includes a plurality of reference regions (hereinafter referred to as "dies") 91 each corresponding to a chip to be ultimately manufactured. The relative position is determined relative to the reference position of each die 91.

Subsequently, the image data 712 and the category data 715 of more than one defect data 72 are transmitted to a display control section 65, at which a category assigned to each defect image is specified with reference to the category data 715 (step S32). Thereafter, each image data 712 is provided with an edge of a color according to the category specified by the display control section 65, while defect images are arranged on the display 55 according to the order decided by the display order deciding section 61 (step S33).

Figure 8:
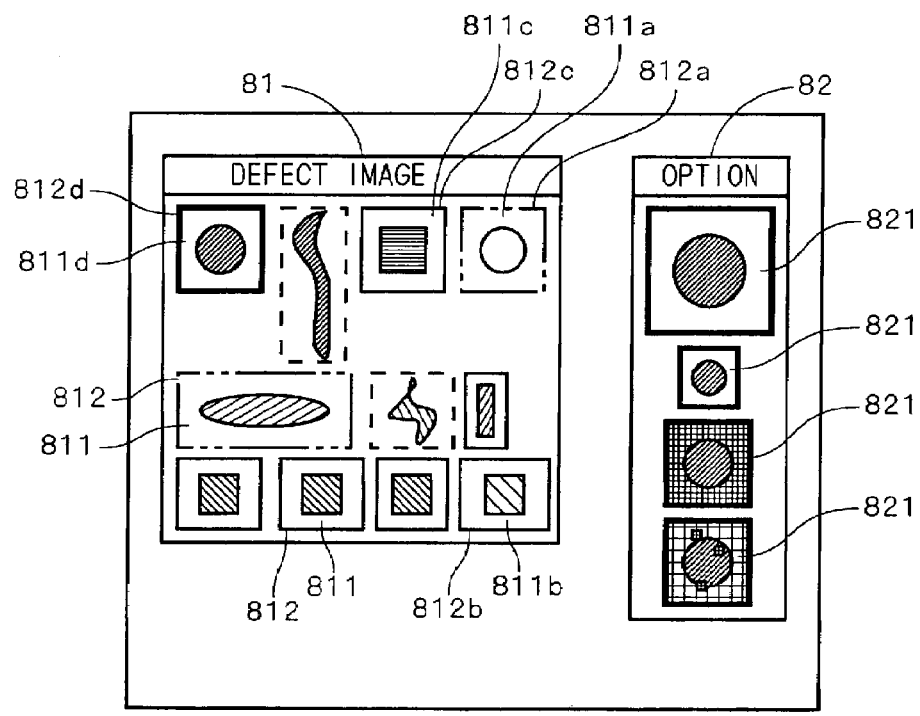
FIG. 8 shows exemplary images displayed on the display.

Following the foregoing processes, images are displayed on the display 55, the examples of which are shown in FIG. 8. Defect images 811 are arranged in a defect image window 81 according to the display order. An edge 812 of each defect image 811 is classified by coloring according to the category. In FIG. 8, the edges 812 are represented by different types of lines to show the differences in color therebetween. For example, in the defect image window 81 of FIG. 8, a defect image shown to be circular in the upper-right hand corner and designated by reference numeral 81a, and a defect image shown to be rectangular in the lower-right hand corner and designated by reference numeral 811b, are included in different categories. Therefore, the defect image 811a is provided with an edge 812a represented by alternate long and two short dashed lines, and the defect image 811b is provided with an edge 812b represented by solid lines. A defect image 811c shown to be rectangular is included in the same category as the defect image 811b, and is thus provided with an edge 812c represented by solid lines. Even when the defect image 811 is an unclassified image, it is also provided with the edge 812 of a color (type of line) indicating unclassification.

Following the foregoing processes, in the host computer 5, the display order of defect images is decided on the basis of the sizes of defect images previously stored in the fixed disc 54, or on the basis of imaging positions for picking up images of the defects. In compliance with the decided order, defect images are arranged on the display 55 by the display control section 65.

When defects classified into the same category have approximately the same size, by deciding the display order on the basis of the size of a defect, defect images to be classified into the same category are displayed in contiguous relation on the display 55. As a result, the operator is allowed to easily classify defect images, namely, classify defects. The size of a defect may be decided on the basis of information contained in the inspection process data 714 indicating a defect detection area.

Depending on the type of a defect or the process performed on the substrate 9, defects may be generated at the same relative coordinate in each die 91, or at a specific position on the substrate 9. In this case, defect images may be displayed on the basis of respective imaging positions, so that the operator is allowed to easily perform classification of defect images.

Using the category data 715, the host computer 5 determines whether a category is assigned or not, and specifies a category already assigned. The display control section 65 provides visual signs indicative of categories, to arrange defect images on the display 55. In the subsequent classification work, the operator is thus allowed to easily make reference to other images included in a category to be assigned. As a result, defects can be easily classified with high precision. A visual sign to be provided is not limited to the edge 812. Alternatively, it may be an underline or a mark, for example.

Figure 9:
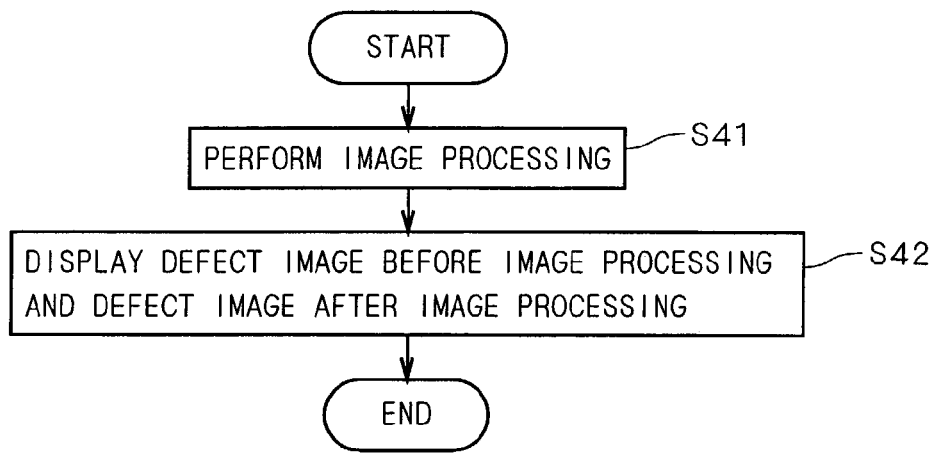
FIGS. 9 and 10 show exemplary processes for assisting an input of a category.

After defect images are displayed in list form, the host computer 5 further assists the operator with category input. The exemplary process flow of which is as shown in FIG. 9.

First, through the input part 56, the operator selects a desired one of the plurality of defect images 811 among those displayed on the display 55. In the defect image window 81 of FIG. 8, a defect image shown to be circular in the upper-left hand corner and designated by reference numeral 811d is selected by the operator. An edge 812d of the selected defect image 811d is distinctively displayed to indicate that is the image 811d selected by the operator. In FIG. 8, this selection is shown by the greater linewidth of the edge 812d than those of the other edges. A selected defect image is either the one assigned with a category, or an unclassified defect image.

Next, the operator selects "image processing" from menu items directed to classification assistance (not shown). Then the image data 712 of the selected defect image 811d is transmitted to an image processing section 62, at which desired image processing is performed on the image data 712 (step S41). The image processing at the image processing section 62 includes scaleup or scaledown, brightness conversion, smoothing, noise addition, rotation, and the like. Image data after being subjected to image processing is transmitted to the display control section 65, and thereafter, together with the defect image 811d before image processing, is displayed on the display 55 in an optional window 82 as defect images 821 after being subjected to image processing (step S42). As a result, even when a defect image has low resolution, or imaging conditions thereof are different from those of other defects at the image pickup apparatus 2, the operator is allowed to recognize features of the defect, to perform precise teaching.

Figure 10:
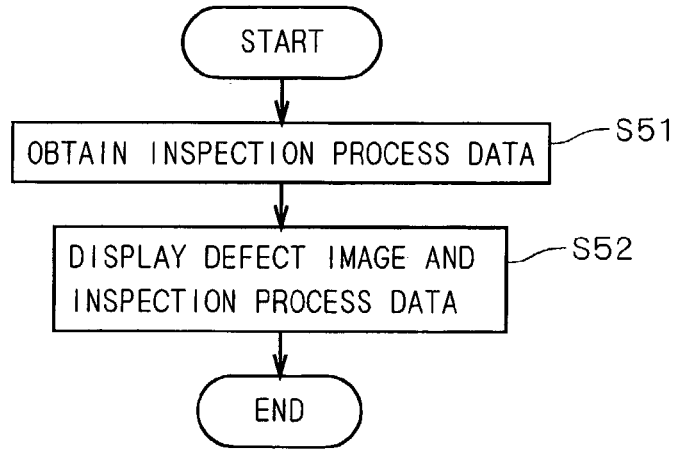
Figure 11:
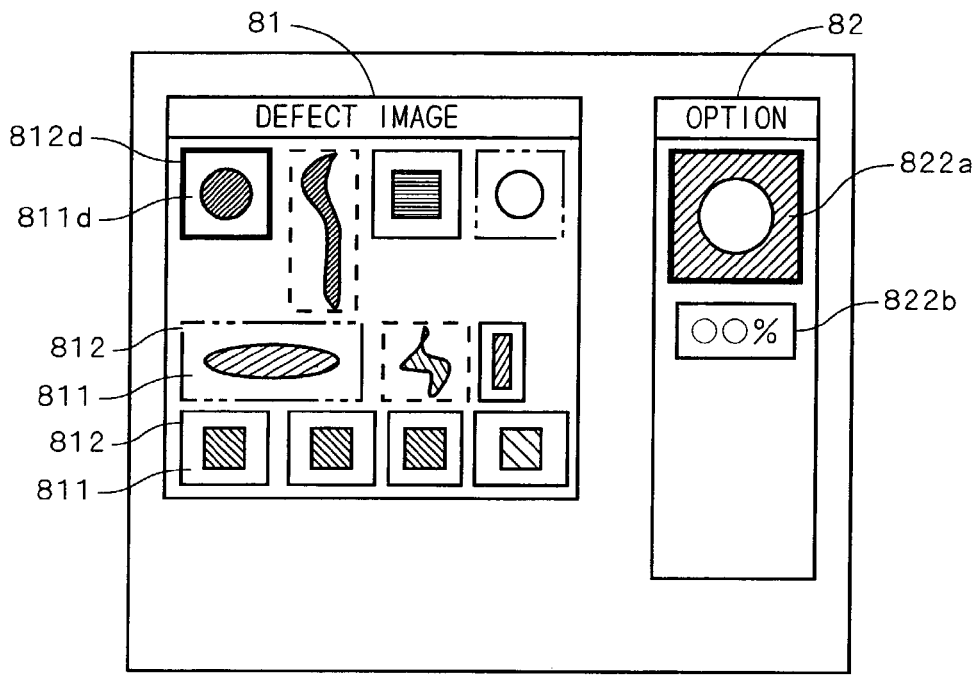
FIG. 11 shows exemplary images displayed on the display.

FIG. 10 shows another exemplary process flow of the classification assisting apparatus for assisting the operator with category input. FIG. 11 shows exemplary images displayed on the display 55 by the processes of FIG. 10.

As already described, data used for inspection at the inspection processing part 41 (inspection process data 714) is previously transmitted from the memory 411 of the inspection processing part 41 to the fixed disc 54 (step S51).

The operator selects a desired one of the defect images 811 through the input part 56. In FIG. 11, the defect image 811d is shown to be the image selected by the operator. Thereafter, the operator selects "display inspection process data" from the menu items directed to classification assistance (not shown). Then the inspection process data 714 corresponding to the selected defect image 811d is transmitted to the display control section 65, whereby together with the defect image 811d, the content of the inspection process data 714 is displayed on the display 55 in the optional windows 82 (step S52).

As for the inspection process data 714, when image processing is performed at the inspection processing part 41, image data after processing (including data of an edge image, of a differential image, or the like) is contained in the inspection process data 714, for example. As another example, when a value (such as feature value) to be used for inspection is calculated at the inspection processing part 41, the calculated value is contained in the inspection process data 714. Alternatively, data of a reference image used for inspection may be contained in the inspection process data 714. In FIG. 11, together with the defect image 811d displayed in the defect image window 81, a defect image 822a after being subjected to image processing at the inspection processing part 41, and a value 822b calculated at the inspection processing part 41, are displayed in the optional window 82.

When the data obtained by the inspection processing part 41 is displayed together with the defect image 811, the operator is allowed to make reference to more information for determining a category of a defect image. Further, by making comparison between the displayed inspection process data and the displayed defect image 811, it is also allowed to determine whether the conditions of inspection at the inspection processing part 41 (mainly, parameters for calculation) are suitable.

Figure 12:
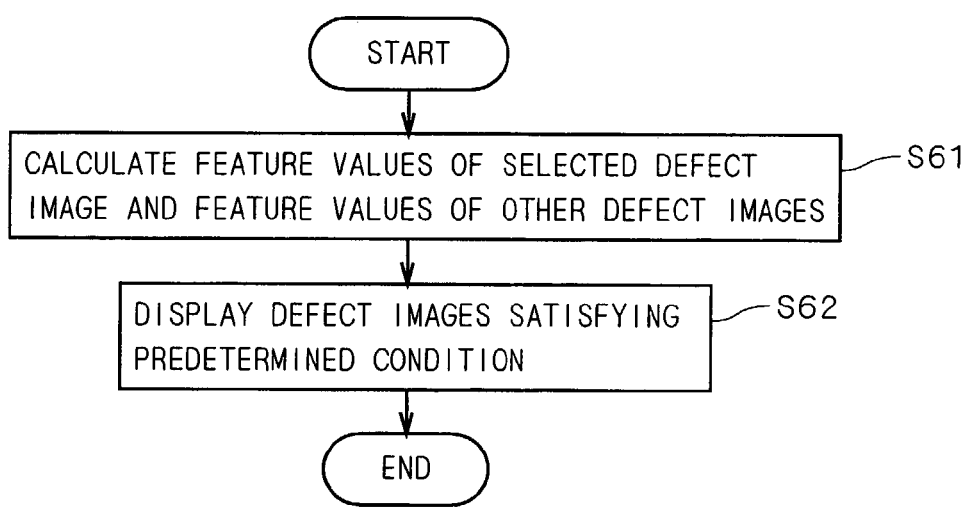
FIG. 12 shows another exemplary process for assisting an input of the category.
Figure 13:
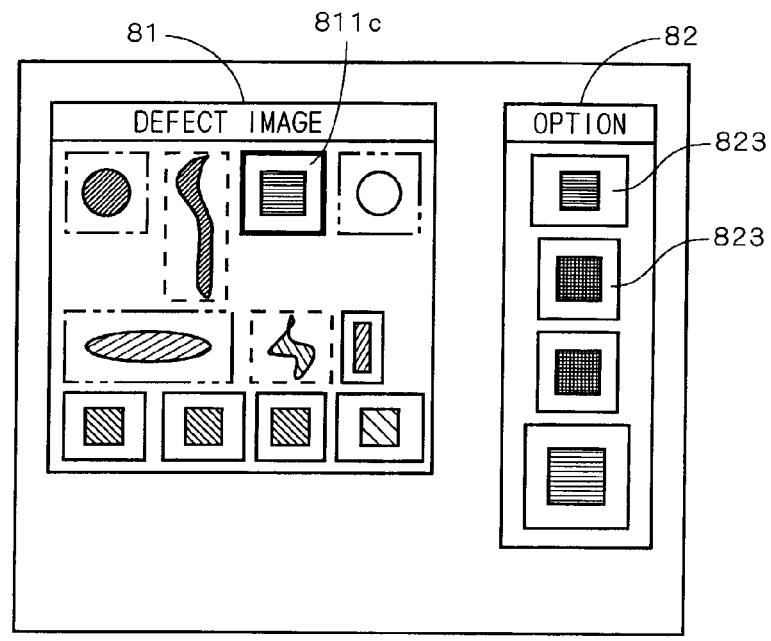
FIGS. 13 and 14 show exemplary images displayed on the display.

FIG. 12 shows still another exemplary process flow of the host computer 5 for assisting the operator with category input. FIG. 13 shows exemplary images displayed on the display 55 by the processes of FIG. 12.

The operator selects a desired defect through the input part 56, and thereafter, selects either "display similar image" or "display dissimilar image" from the menu items directed to classification assistance.

In FIG. 13, the defect image 811c is shown to be the selected image. When "display similar image" is selected, the defect data 72 of the defect image 811c and each defect data 72 of other defects are transmitted to the feature value calculating section 63. Feature values of the defect image 811c and feature values of each one of the plurality of other defect images are calculated from the image data 712 of the received defect data 72 at the feature value calculating section 63 (step S61). The defect image having a small difference in feature value (one or more feature values) from the selected defect image is selected from the other defect images as a similar image. With respect to determination of difference, when a feature value is a vector value, or more than one feature values are to be referred to, a defect image whose Euclidean distance of feature values (feature value group) from the selected defect image is shorter than a predetermined value is selected as a similar image.

The image data 712 of the selected similar images are transmitted to the display control section 65, and thereafter, defect images 823 similar to the defect image 811c are displayed on the display 55 in the optional window 82 as shown in FIG. 13 (step S62). For calculation of feature values at the feature value calculating section 63, an area directed to calculation of feature values is determined according to the information indicating a defect detection area which is transmitted as part of the inspection process data 714.

Figure 14:
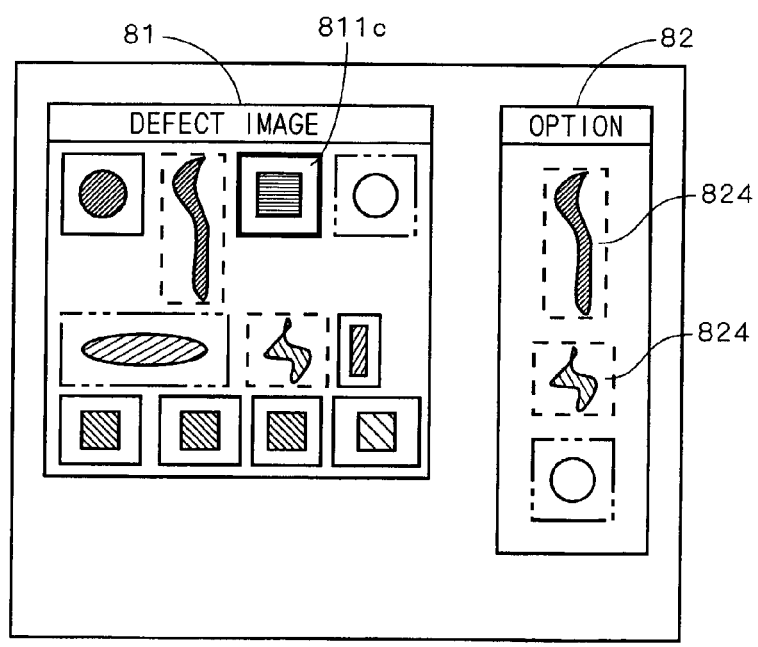

When "display dissimilar image" is selected from the menu items, on the basis of features values respectively calculated from the selected defect image and the other defect images, a defect image having a difference in feature value (or Euclidean distance) larger than a predetermined value, is selected as a dissimilar image from the other defect images. Then the image data 712 of the dissimilar images are transmitted to the display control section 65. Thereafter, together with the defect image 811c, dissimilar images 824 are displayed on the display 55 in the optional window 82 as shown in FIG. 14 (steps S61 and S62).

By making selection to display a defect image targeted for classification and the defect images 823 similar in feature value to the target defect image on the display 55, a defect image having similarity in feature value can be easily found even when a defect image has a low resolution, or there is variation in resolution thereof. When a defect image targeted for classification and the defect images 824 having dissimilarity in feature value are displayed, a defect image which is singular data (or peculiar data) can be found, though the defect image is already assigned with the same category as that of the targeted defect image. Here, the defect image of singular data indicates an image largely different in feature value from the targeted defect image. In creation of the training data, such singular data largely influences the performance of automatic classification. In view of this, the quality of the training data can be improved by dealing with the singular data suitably.

The process flow for assisting classification shown in FIG. 12 becomes operative with only a visual sign indicating similarity or dissimilarity provided to an image displayed in the defect image window 81. Further, alternative way may be employed to determine similarity or dissimilarity. Still further, an image to be displayed in the optional window 82 is not limited to a similar image or to a dissimilar image. It may alternatively be the one having feature values that satisfy predetermined conditions defined by feature values of a defect image targeted for classification.

Figure 15:
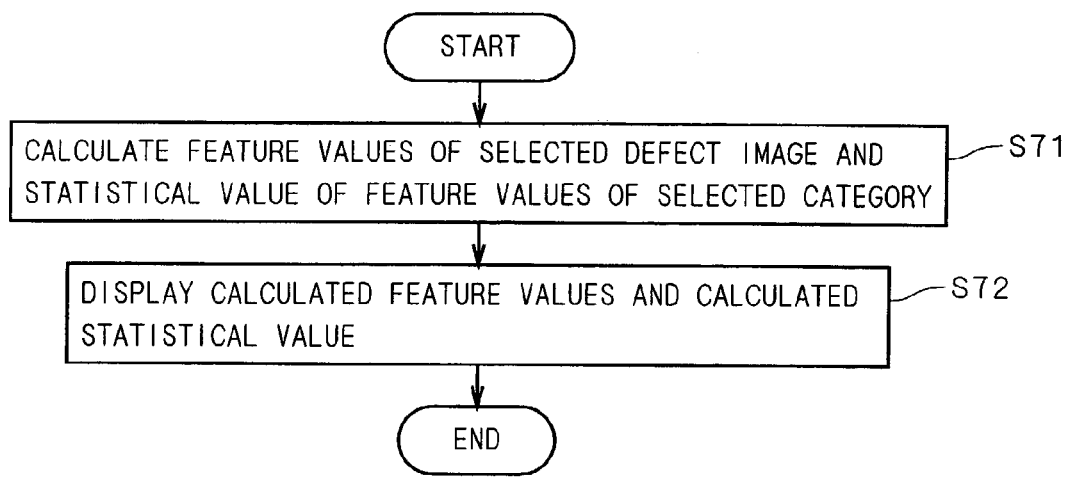
FIGS. 15 and 16 show exemplary processes for assisting an input of a category.
Figure 16:
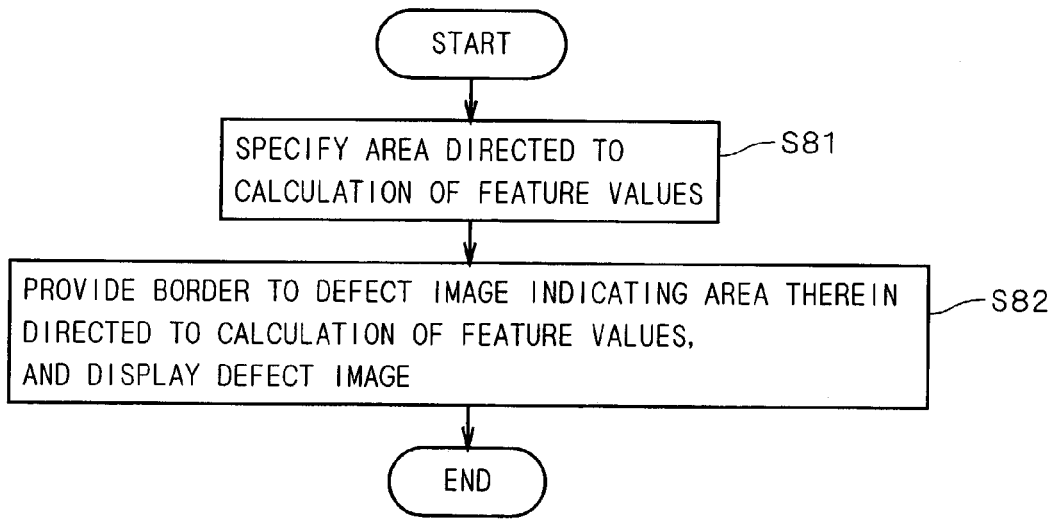

FIGS. 15 and 16 show other exemplary process flows of the host computer 5 for assisting the operator with category input. The operator selects "display statistical information" from the menu items, and then the flow of FIG. 15 starts. First, feature values of data of a defect image selected by the operator as a target for classification, and feature values of the image data 712 of more than one defect data 72 included in a category selected by the operator (hereinafter referred to as "feature values of a selected category"), are calculated at the feature value calculating section 63, whereby a statistical value (such as a mean value) of feature values of the selected category is calculated (step S71). Next, the calculated statistical value and the feature values of the selected defect image are displayed on the display 55 (step S72).

The operator selects "display border" from the menu items, and then the flow of FIG. 16 starts. First, an area directed to calculation of feature values in the image data 712 (defect image) selected for category input by the operator is specified (step S81), and thereafter the border of the area is recognizably displayed with the defect image (step S82).

Figure 17:
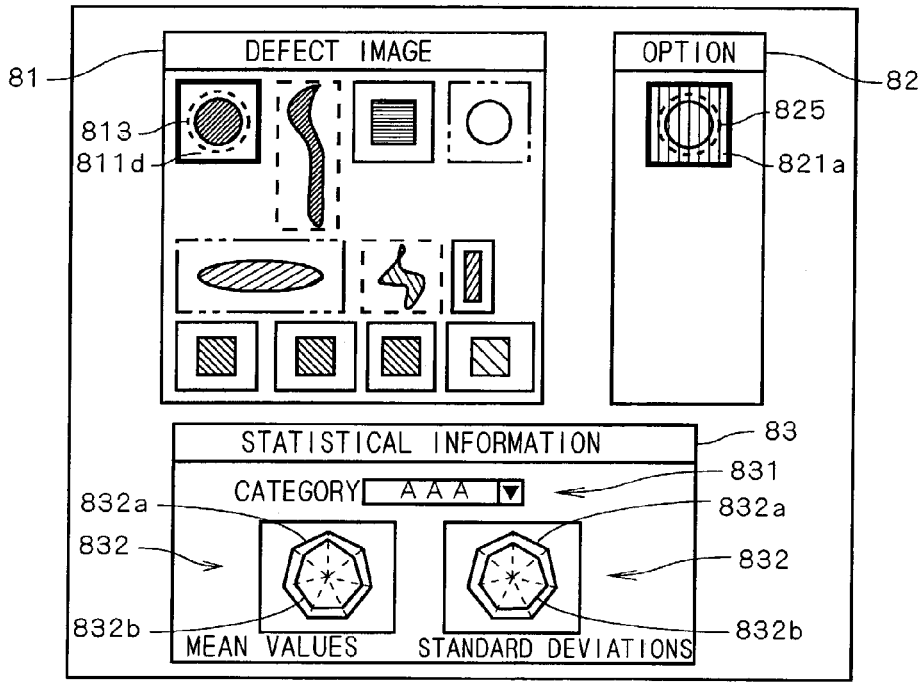
FIGS. 17 and 18 show exemplary images displayed on the display.
Figure 18:
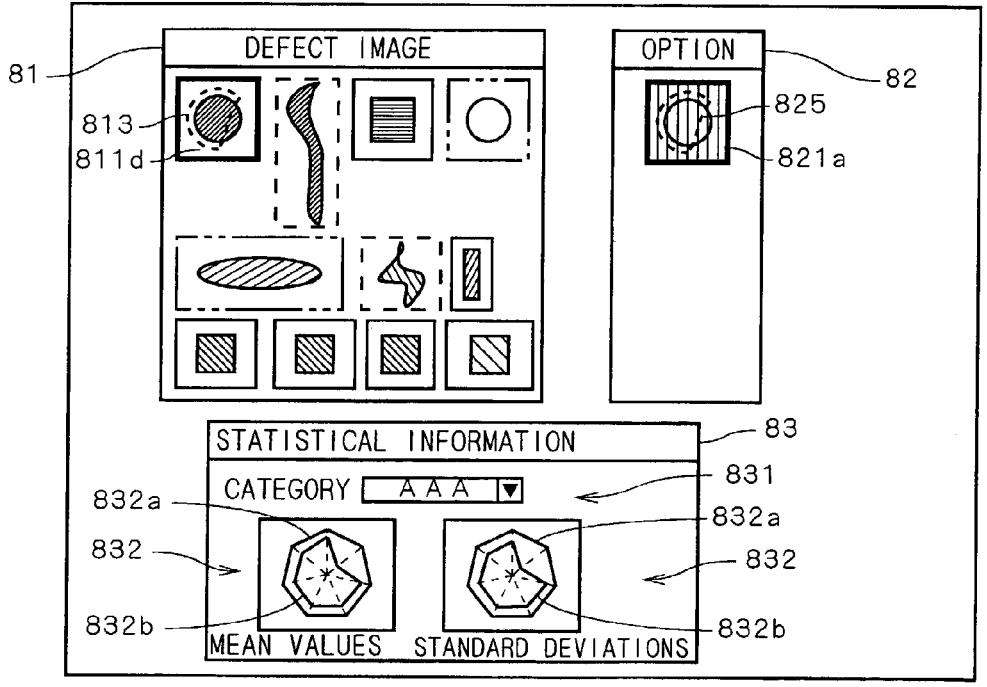

With reference to FIGS. 17 and 18, the processes shown in FIGS. 15 and 16 will be described in more detail.

The operator previously selects a desired defect image through the input part 56. In FIG. 17, the defect image 811d in the upper-left hand corner of the defect image window 81 is shown to be the selected image targeted for category input. When the operator selects "display statistical information" from the menu items, a statistical information window 83 shown in FIG. 17 appears on the display 55. When a desired category is selected from a category selection box 831 in the statistical information window 83, the host computer 5 makes reference to the category data 715 of the defect data 72 stored in the fixed disc 54, and more than one defect data 72 included in the selected category are transmitted to the feature value calculating section 63. The defect data 72 of the selected defect image 811d is also transmitted to the feature value calculating section 63, at which feature values of the selected category and feature values of the defect image 811d are calculated. After calculation of feature values, feature values of the selected category are transmitted to a statistical value calculating section 64, at which a statistical value(s) of feature values of the selected category is calculated (step S71).

Next, the statistical value(s) of feature values of the selected category and feature values of the defect image 811d are transmitted to the display control section 65. Thereafter, data of the respective values are displayed on the display 55 in the statistical information window 83 (step S72), whereby with reference to feature values, a category to include a defect image targeted for classification can be easily inputted.

In FIG. 17, respective mean values and standard deviations of various types of feature values included in the selected category are shown as radar graphs 832. In each radar graph 832, a line 832a and a line 832b running along with the line 832a are displayed. The line 832a indicates statistical values of respective feature values (correctly, respective types of feature values) included in the selected category. The line 832b indicates various feature values of the defect image

811*d*. Accordingly, the tendency of the various feature values of the defect image 811*d* relative to the respective feature values of the selected category can be easily recognized. As a result, the operator is allowed to more suitably determine a category to include the selected defect image on the basis of various feature values.

When the operator selects a category from the category selection box 831 different from the selected category, the processing part 6 immediately follows the processes shown in FIG. 15 with respect to the newly selected category. The results of calculation thus obtained are displayed in the same manner. When a defect image already assigned with a category is changed to a new category, the processing part 6 also follows the processes of FIG. 15 immediately, to display statistical values of feature values again. That is, every time a different category is selected, or every time a category of the selected defect image is changed, the processing part 6 calculates feature values of a defect image included in a category to be displayed, and renews the contents displayed on the display 55. As a result, the operator is allowed to easily recognize the tendency of feature values of the selected defect image 811*d* relative to a category whose statistical values are displayed. Even when a defect image included in a category is arbitrarily changed after defect image classification, the result of classification is readily reflected on statistical values by recalculation thereof. A category to be selected may be a category group including a plurality of categories (or all categories).

When the operator selects "display border" from the menu items, and when feature values are to be calculated from a partial region of a defect image, a border 813 indicating an area directed to calculation of feature values is displayed on the defect image 811*d* as shown in FIG. 17. Further, when step S52 of FIG. 10 for assisting classification has been already performed to display an image after being subjected to image processing in the inspection processing, a defect image 821*a* after being subjected to image processing is also displayed with a border 825 in the optional window 82 shown in FIG. 17. An area, directed to calculation of feature values to be referred to for category input, may be displayed on the display 55 in another manner allowing the area to be distinctively indicated. For example, it may be displayed in slightly different color. An area directed to calculation of feature values may be the one already used for calculation of feature values at the inspection processing part 41. Alternatively, it may be determined by image processing performed by the host computer 5. Still alternatively, it may be an area previously determined by the operator through the input part 56.

When there is unbalance in an area directed to calculation of feature values, namely, when a defect site is not entirely covered as an area for calculation, the line 832*b* indicating various feature values of the defect image 811*d* shows no similarity to the line 832*a* indicating respective feature values of a selected category as shown in FIG. 18. In this case, the defect data 72 of the defect image 811*d* may become singular data. In light of this, by selecting a defect image considered to be singular data and displaying a border thereof, it is conversely allowed to determine whether feature values have been calculated from an appropriate area. As described so far, with reference to various feature values indicated by the line 832*b* and to an area used for calculation of feature values indicated by a border, it can be accurately determined whether or not data of a selected defect image is usable for creation of the training data.

When an area defined by the inspection processing part 41 is applied again as an area directed to calculation of feature values, and when singular data frequently appears, settings such as conditions of imaging at the image pickup part 21, or conditions of determination of a defect area at the inspection processing part 41, may be inappropriately made. In this case, display of a border can be used for optimize condition making at the inspection processing part 41. Further, all defect images subjected to calculation of feature values may be displayed together with respective borders.

As described so far, according to the host computer 5 for assisting classification work by the operator, the operator is allowed to arbitrarily select more than one processing, so that the host computer 5 is operative to assist classification in response to characteristics of defects. As a result, category input by the operator with respect to a defect image is suitably assisted by the host computer 5, whereby high-quality training data can be created.

The preferred embodiments of the present invention are as described above. However, the present invention is not limited to the foregoing preferred embodiments, but various modifications thereof are feasible.

A semiconductor substrate undergoes inspection in the inspection system 1. Alternatively, a glass substrate, a printed circuit board, or a mask substrate used for exposure of a substrate, may be applicable as a target to be inspected. Further, assistance of category input (namely, classification) described in the foregoing preferred embodiments may be employed in an inspection system for inspecting not only defects but also other objects.

In the foregoing preferred embodiments, the auto classification part 42 and the host computer 5 performing learning become operative on software by respective CPUs, for example. When it is required to increase the amount of processing of defects targeted for auto classification, the auto classification part 42 may include an electric circuit for its exclusive use. When flexibility such as change in conditions is required, yet the amount of processing of defects targeted for auto classification is not required in large quantity, the host computer 5 or another computer separately prepared may be operative to perform the functions of the auto classification part 42.

The defect data 72 to be used for learning may be the one previously prepared. Alternatively, the detected defect data 71 stored in the memory 411 of the inspection processing part 41 may also be usable as the defect data 72. Still alternatively, the defect data 72 contains both the previously prepared data and the detected defect data 71.

Feature values of the image data 712 calculated at the host computer 5 may alternatively be calculated at the auto classification part 42. Namely, data after being subjected to automatic classification may be usable again. Still alternatively, as described above, data already calculated at the inspection processing part 41 may be usable again. In other words, the functions of the classification assisting apparatus can be provided in any form in the inspection system 1.

A graph to be displayed in the statistical information window 83 is not limited to a radar graph. Information may be displayed therein in an alternative way other than a graph.

In the foregoing preferred embodiments, using data obtained in the inspection processing, classification for creating the training data is assisted. Further, using a display including an image after being subjected to image processing, a similar or a dissimilar image, or a border, classification with respect to a defect image having a low resolution (or an image having wide variation affected by properties of a target object to be inspected or by imaging conditions) is assisted. In view of this, the present invention is preferably applied to an in-line system for automatic classification (or for classification for learning thereof) of defect images, but alternatively, it may be applied to a so-called off-line classification apparatus.

While the invention has been shown and described in detail, the foregoing description is in all aspects illustrative and not restrictive. It is therefore understood that numerous modifications and variations can be devised without departing from the scope of the invention.

What is claimed is:

1. An apparatus for assisting an input to classify an image of an object, said image being obtained in inspection, comprising:
   a display for displaying images;
   an input device for accepting an input to classify an image of an object on a substrate; and
   a processing part for deciding order of a plurality of objects on the basis of imaging positions for picking up a plurality of images, prepared in advance, of said plurality of objects, to arrange said plurality of images on said display according to said order, said imaging positions being selectable between absolute positions on a substrate and relative positions in a plurality of reference regions on said substrate and providing a visual sign indicative of a defect class of each of said plurality of objects, said visual sign being an outline surrounding each of said plurality of images and at least a property of said outline varying in accordance to the defect class of each of said plurality of objects.

2. An apparatus for assisting an input to classify an image of an object, said image being obtained in inspection, comprising:
   a display for displaying images;
   an input device for accepting an input to classify an image of an object; and
   a processing part for arranging a plurality of images prepared in advance each indicating an object, in a window on said display according to order of a plurality of objects on the basis of sizes of said plurality of objects indicated by said plurality of images, or on the basis of imaging positions for picking up said plurality of images of said plurality of objects, while specifying a defect class assigned to each of said plurality of images, and providing a visual sign indicative of the defect class of each of said plurality of objects, said visual sign being an outline surrounding each of said plurality of images and at least a property of said outline varying in accordance to the defect class of each of said plurality of objects.

3. An apparatus for assisting an input to classify an image of an object, said image being obtained in inspection, comprising:
   a display for displaying images;
   an input device for accepting an input to classify an image of an object; and
   a processing part for performing image processing which changes pixel values included in said image of said object, to display a plurality of images after being subjected to image processing together with said image of said object on said display and providing a visual sign indicative of a defect class of said object, said visual sign being an outline surrounding each of said plurality of images and at least a property of said outline varying in accordance to the defect class of said object.

4. The apparatus according to claim 3, further comprising:
   a receiver for receiving data of an image of an object from an inspection apparatus for sequentially inspecting a plurality of objects to be inspected; and
   a memory for storing said data of said image.

5. An apparatus for assisting an input to classify an image of an object, said image being obtained in inspection, comprising
   a display for displaying image,
   an input device for accepting an input to classify an image of an object; and
   a processing part for calculating feature values of a plurality of images prepared in advance each indicating an object, and a feature values of an image targeted for an input of a defect class, to distinctively display selected images among said plurality of images on said display, each of said selected images having a larger difference in feature value from said image targeted for said input of said defect class than a predetermined value, each of said selected images displayed on said display being provided a visual sign indicative of a defect class of said object, said visual sign being an outline surrounding each of said selected images and at least a property of said outline varying in accordance to the defect class of said object.

6. The apparatus according to claim 5, further comprising:
   a receiver for receiving data of an image of an object from an inspection apparatus for sequentially inspecting a plurality of objects to be inspected; and
   a memory for storing said data of said image.

7. An apparatus for assisting an input to classify an image of an object, said image being obtained in inspection, comprising:
   a display for displaying an image;
   an input device for accepting an input to classify an image of an object; and
   a processing part for specifying an area of said image of said object, said area being directed to calculation of a feature value to be referred to for an input of a defect class and said area being a partial region of said image, to display said feature value and said image of said object on said display in a manner allowing said area to be distinctively indicated and providing a visual sign indicative of the defect class of said object, said visual sign being an outline surrounding said image of the object and at least a property of said outline varying in accordance to the defect class of said object.

8. The apparatus according to claim 7, further comprising:
   a receiver for receiving data of an image of an object from an inspection apparatus for sequentially inspecting a plurality of objects to be inspected; and
   a memory for storing said data of said image.

9. A computer-readable medium carrying a program for assisting an input to classify an image of an object to be inspected on a substrate, said image being obtained in inspection, wherein execution of said program by a computer causes said computer to perform the steps of:
   deciding order of a plurality of objects on the basis of imaging positions for picking up a plurality of images, prepared in advance, of said plurality of objects, said imaging positions being selectable between absolute positions on a substrate and relative positions in a plurality of reference regions on said substrate;
   arranging said plurality of images on a display according to said order; and
   providing a visual sign indicative of a defect class of each of said plurality of objects, said visual sign being an outline surrounding each of said plurality of images and at least a property of said outline varying in accordance to the defect class of each of said plurality of objects.

10. A computer-readable medium carrying a program for assisting an input to classify an image of an object, said image being obtained in inspection, wherein execution of said program by a computer causes said computer to perform the steps of:

specifying a defect class assigned to each of plurality of images, said plurality of images being prepared in advance each indicating an object; and arranging said plurality of images in a window on a display according to order of a plurality of objects on the basis of sizes of said plurality of objects indicated by said plurality of images, or on the basis of imaging positions for picking up said plurality of images of said plurality of objects while providing a visual sign indicative of a defect class of each of said plurality of objects, said visual sign being an outline surrounding each of said plurality of images and at least a property of said outline varying in accordance to the defect class of each of said plurality of objects.

11. A computer-readable medium carrying a program for assisting an input to classify an image of an object, said image being obtained in inspection, wherein execution of said program by a computer causes said computer to perform the steps of:

performing image processing which changes pixel values included in said image of said object;

displaying a plurality of images after being subjected to image processing together with said image of said object on a display; and providing a visual sign indicative of a defect class of said object, said visual sign being an outline surrounding each of said plurality of images and at least a property of said outline varying in accordance to the defect class of said object.

12. A computer-readable medium carrying a program for assisting an input to classify an image of an object, said image being obtained in inspection, wherein execution of said program by a computer causes said computer to perform the steps of:

calculating feature values of a plurality of images prepared in advance each indicating an object, and a feature values of an image targeted for an input of a defect class; and distinctively displaying selected images among said plurality of images on a display, each of said selected images having a larger difference in feature value from said image targeted for said input of said defect class than a predetermined value, each of said selected images displayed on said display being provided a visual sign indicative of a defect class of said object, said visual sign being an outline surrounding each of said selected images and at least a property of said outline varying in accordance to the defect class of said object.

13. A computer-readable medium carrying a program for assisting an input to classify an image of an object, said image being obtained in inspection, wherein execution of said program by a computer causes said computer to perform the steps of:

specifying an area of said image of said object, said area being directed to calculation of a feature value to be referred to for an input of a defect class and said area being a partial region of said images; and displaying said feature value and said image of said object on a display in a manner allowing said area to be distinctively indicated and providing a visual sign indicative of the defect class of said object, said visual sign being an outline surrounding said image of the object and at least a property of said outline varying in accordance to the defect class of said object.

* * * * *